(12) United States Patent
Ikebe et al.

(10) Patent No.: US 11,979,983 B2
(45) Date of Patent: May 7, 2024

(54) PRINTED WIRING BOARD AND METHOD OF MANUFACTURING THE SAME

(71) Applicant: SUMITOMO ELECTRIC INDUSTRIES, LTD., Osaka (JP)

(72) Inventors: Maki Ikebe, Osaka (JP); Koji Nitta, Osaka (JP); Shoichiro Sakai, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 331 days.

(21) Appl. No.: 17/595,942

(22) PCT Filed: Jul. 4, 2019

(86) PCT No.: PCT/JP2019/026702
§ 371 (c)(1),
(2) Date: Nov. 30, 2021

(87) PCT Pub. No.: WO2021/002009
PCT Pub. Date: Jan. 7, 2021

(65) Prior Publication Data
US 2022/0232699 A1    Jul. 21, 2022

(51) Int. Cl.
*H05K 1/09* (2006.01)
*C25D 3/38* (2006.01)
*C25D 7/00* (2006.01)
*H05K 3/18* (2006.01)

(52) U.S. Cl.
CPC ............. *H05K 1/09* (2013.01); *C25D 3/38* (2013.01); *C25D 7/00* (2013.01); *H05K 3/188* (2013.01)

(58) Field of Classification Search
CPC ................... H05K 1/09; H05K 3/188
See application file for complete search history.

(56) References Cited

U.S. PATENT DOCUMENTS

| 2005/0174722 A1 | 8/2005 | Hiranaka et al. |
| 2008/0257746 A1 | 10/2008 | Ono et al. |
| 2013/0240368 A1 | 9/2013 | Allardyce et al. |

FOREIGN PATENT DOCUMENTS

| JP | 2004-031370 | 1/2004 |
| JP | 2007-182623 | 7/2007 |
| JP | 2011-171423 | 9/2011 |
| JP | 2012-169597 | 9/2012 |
| JP | 2013-060660 | 4/2013 |
| JP | 2014-125679 | 7/2014 |

*Primary Examiner* — Jeremy C Norris
(74) *Attorney, Agent, or Firm* — IPUSA, PLLC

(57) ABSTRACT

A printed wiring board includes an electrically insulating base film, and an electrically conductive pattern stacked on at least one surface side of the base film. An average width of multiple wiring portions included in the electrically conductive pattern is 5 μm or greater and 20 μm or less. Each of the wiring portions includes a seed layer and a plating layer. The plating layer includes copper crystal planes of a (111) plane, a (200) plane, a (220) plane, and a (311) plane. An intensity ratio $IR_{220}$ of an X-ray diffraction intensity of the copper crystal plane (220) obtained by Equation (1) below is 0.05 or greater and 0.14 or less, $$IR_{220}=I_{220}/(I_{111}+I_{220}+I_{311}) \qquad (1)$$

(where $I_{111}$, $I_{200}$, $I_{220}$, $I_{311}$ are respectively X-ray diffraction intensity of the (111) plane (200) plane, the (220) plane, and the (311) plane).

7 Claims, 1 Drawing Sheet

PRINTED WIRING BOARD AND METHOD OF MANUFACTURING THE SAME

TECHNICAL FIELD

The present disclosure relates to a printed wiring board and a method of manufacturing the same.

BACKGROUND ART

In recent years, electronic devices are required to have higher performance, smaller size, and lighter weight. Accordingly, there is a need for a printed wiring board having a fine electrically conductive pattern. Here, a flexible printed circuit board having a fine electrically conductive pattern and a method of manufacturing the same have been proposed. This proposal relates to a flexible printed circuit board in which a copper thin film made of copper or an alloy containing copper as a main component is directly adhered to at least one surface of a plastic film, wherein the interface structure between the plastic film and the copper thin film and the crystal structure of the subsequently grown copper thin film are controlled by controlling the state of the surface of the plastic film substrate, on which the copper thin film is to be formed, to optimize the conditions for forming the copper thin film, whereby the adhesion is very strong and a high-definition circuit pattern can be formed by etching, and a method of manufacturing the flexible printed circuit (Japanese Patent Laid-Open No. 2004-31370).

RELATED ART DOCUMENTS

Patent Documents

Patent Document 1 : Japanese Patent Application Laid-Open No. 2004-31370

Summary of the Invention

A printed wiring board according to an embodiment of the present disclosure includes: an electrically insulating base film; and an electrically conductive pattern stacked on at least one surface side of the base film, wherein the electrically conductive pattern includes a plurality of wiring portions, wherein an average width of the plurality of wiring portions is 5 μm or greater and 20 μm or less, wherein each of the plurality of wiring portions includes a seed layer containing copper as a main component and a plating layer stacked on the seed layer and containing copper as a main component, wherein crystal planes of copper crystal grains included in the plating layer include a (111) plane, a (200) plane, a (220) plane, and a (311) plane, and wherein an intensity ratio $IR_{220}$ of an X-ray diffraction intensity of the (220) plane obtained by Equation (1) below is 0.05 or greater and 0.14 or less.

$$IR_{220} = I_{220}/(I_{111} + I_{200} + I_{220} + I_{311}) \quad (1)$$

(where $I_{111}$ is an X-ray diffraction intensity of the (111) plane, $I_{200}$ is an X-ray diffraction intensity of the (200) plane, $I_{220}$ is the X-ray diffraction intensity of the (220) plane, and $I_{311}$ is an X-ray diffraction intensity of the (311) plane in Equation (1)).

The method of manufacturing a printed wiring board according to the present disclosure includes a step of forming an electrically conductive pattern including a plurality of wiring portions, by a semi-additive process, on at least one surface side of an electrically insulating base film, wherein the step of forming the electrically conductive pattern includes a step of stacking a seed layer containing copper as a main component on the one surface side of the base film, a step of forming a resist pattern on a surface of the seed layer, the resist pattern having a reversal shape of the plurality of wiring portions, a step of stacking a plating layer containing copper as a main component on the surface of the seed layer after the step of foaming the resist pattern, a step of removing the resist pattern after the step of stacking the plating layer, and a step of removing, by etching, the seed layer exposed by the step of removing the resist pattern, after an elapse of 24 hours or greater since an end of the step of stacking the plating layer.

EMBODIMENT FOR CARRYING OUT THE INVENTION

Figure 1:
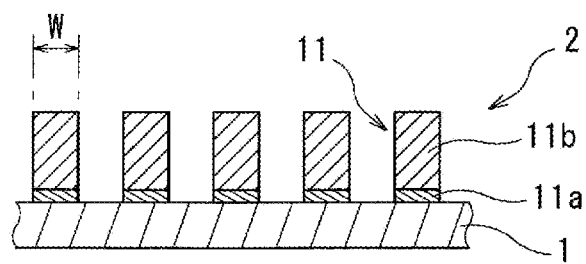
FIG. 1 is a schematic cross-sectional view illustrating a printed wiring board according to an embodiment of the present invention.

Problem to be Solved by the Present Disclosure

When a printed wiring board having a fine electrically conductive pattern as proposed in Patent Document 1 is manufactured, there is a possibility that product defects may occur due to roughness of a wiring portion surface at the time of manufacturing, as compared with manufacturing a conventional printed wiring board.

The present disclosure has been made in view of such circumstances, and an object of the present disclosure is to provide a printed wiring board having a fine electrically conductive pattern, in which the roughness of a wiring portion surface at the time of manufacturing is small, and to provide a method of manufacturing the printed wiring board.

Effects of the Present Disclosure

According to the present disclosure, it is possible to provide a printed wiring board capable of reducing roughness of a wiring portion surface at the time of manufacturing even if the printed wiring board has a fine electrically conductive pattern, and it is possible to provide a method of manufacturing a printed wiring board capable of manufacturing a printed wiring board having a fine electrically conductive pattern and having a wiring portion surface with reduced roughness.

Description of Embodiments of the Present Invention

Embodiments of the present invention will be listed and described.

A printed wiring board according to an embodiment of the present disclosure includes: an electrically insulating base film; and an electrically conductive pattern stacked on at least one surface side of the base film, wherein the electrically conductive pattern includes a plurality of wiring portions, wherein an average width of the plurality of wiring portions is 5 μm or greater and 20 μm or less, wherein each of the plurality of wiring portions include a seed layer containing copper as a main component and a plating layer stacked on the seed layer and containing copper as a main component, wherein crystal faces of copper crystal grains included in the plating layer include a (111) plane, a (200) plane, a (220) plane, and a (311) plane, and wherein an intensity ratio $IR_{220}$ of an X-ray diffraction intensity of the (220) plane obtained by Equation (1) below is 0.05 or greater and 0.14 or less.

$$IR_{220} = I_{220}/(I_{111}I_{200}I_{220}+I_{311}) \quad (1)$$

(where $I_{111}$ is an X-ray diffraction intensity of the (111) plane, $I_{200}$ is an X-ray diffraction intensity of the (200) plane, $I_{220}$ is the X-ray diffraction intensity of the (220) plane, and $I_{311}$ is an X-ray diffraction intensity of the (311) plane in Equation (1)).

As a result of intensive studies of the present inventors, it is found that, in a printed wiring board having a fine electrically conductive pattern in which the average width of the plurality of wiring portions is 20 μm or less, roughness of a wiring portion surface after etching causes product defects such as poor appearance and deterioration of high-frequency characteristics. In addition, it is found that etching from a portion of a surface having an orientation, in which a crystal plane included in a copper crystal grain included in a plating layer of a wiring portion is easily scraped, or etching from a portion, in which the grain size of the copper crystal grain is small, leads to roughness of the surface of the wiring portion. Further, it is found that an additive contained in the plating solution necessary for the step of stacking the plating layer is one of the causes for reducing the grain size of the copper crystal grains. In the printed wiring board, the composition ratio of the surface having an orientation in which the copper crystal grains contained in the plating layer are easily scraped decreases, or the average grain size of the copper crystal grains increases, thereby reducing roughness of the surface of the wiring portion at the time of manufacturing.

The average grain size of the copper crystal grains may be 0.2 μm or greater and 8 μm or less. As described above, when the average grain size of the copper crystal grains is within the above range, variation in the grain size of the copper crystal grains can be suppressed, and roughness on the surface of the wiring portion at the time of manufacturing can be reduced.

The intensity ratio $IR_{111}$ of the X-ray diffraction intensity of the (111) plane obtained by the following formula (2) may be 0.74 or greater.

$$IR_{111} = I_{111}/(I_{111}+I_{200}+I_{220}+I_{311}) \quad (2)$$

Here, $I_{111}$, $I_{200}$, $I_{220}$, and $I_{311}$ in formula (2) are as defined for formula (1) above.

When the intensity ratio $IR_{111}$ of the (111) plane is 0.74 or greater, the number of planes having an orientation for being easily scraped is reduced, and roughness of the surface of the wiring portion at the time of manufacturing can be reduced.

The intensity ratio IR220 of the (220) plane of the copper crystal grain may be 0.14 or less when the average width of the plurality of wiring portions is 20 μm, and the intensity ratio $IR_{220}$ of the (220) plane may be 0.11 or less when the average width of the plurality of wiring portions is 15 μm. When the intensity ratio $IR_{220}$ of the (220) plane is equal to or less than the above-described respective numerical values under the conditions of the average width of the plurality of wiring portions, the number of planes having an orientation for being easily scraped is reduced, and roughness of the surface of the wiring portion at the time of manufacturing can be reduced.

When the average width of the plurality of wiring portions is 10 μm, the intensity ratio IR220 of the (220) plane of the copper crystal grain may be 0.08 or less. As described above, even when the average width of the wiring portion is 10 μm, if the intensity ratio $IR_{220}$ of the (220) plane of the copper crystal grain is 0.08 or less, the number of planes having an orientation for being easily scraped is reduced, and roughness of the surface of the wiring portion at the time of manufacturing can be reduced.

The method of manufacturing a printed wiring board according to another aspect of the present invention includes a step of forming an electrically conductive pattern including a plurality of wiring portions, by a semi-additive process, on at least one surface side of an electrically insulating base film, wherein the step of forming the electrically conductive pattern includes a step of stacking a seed layer containing copper as a main component on the one surface side of the base film, a step of foaming a resist pattern on a surface of the seed layer, the resist pattern having a reversal shape of the plurality of wiring portions, a step of stacking a plating layer containing copper as a main component on the surface of the seed layer after the step of forming the resist pattern, a step of removing the resist pattern after the step of stacking the plating layer, and a step of removing, by etching, the seed layer exposed by the step of removing the resist pattern, after an elapse of 24 hours or greater since an end of the step of stacking the plating layer.

As a result of intensive studies of the present inventors, it is found that, in a printed wiring board having a fine electrically conductive pattern with a plurality of wiring portions having an average width of 20 μm or less, roughness of the surface of the wiring portion after etching causes product defects such as poor appearance and poor high-frequency characteristics. In addition, it is found that etching from a portion of a surface having an orientation, in which a crystal plane included in a copper crystal grain included in a plating layer of the wiring portion is easily scraped, or etching from a portion, in which the grain size of the copper crystal grain is small, leads to roughness of the surface of the wiring portion. In addition, it is found that the additive included in the plating solution necessary for the step of stacking the plating layer is one of the causes of reducing the grain size of the copper crystal grains. In the printed wiring board, the etching step is performed after an elapse of 24 hours or greater since an end of the step of stacking the plating layer after the step of removing the resist pattern, so that the composition ratio of the surface having an orientation for being easily scraped in the copper crystal grains included in the plating layer decreases or the average grain size of the copper crystal grains increases, thereby reducing roughness of the surface of the wiring portion at the time of manufacturing.

Preferably, the copper content in the plating solution used in the step of stacking the plating layer is 2 mass % or greater, and the plating solution contains an additive. When the copper content in the plating solution is 2 mass % or greater, copper ions necessary for plating can be supplied. In addition, the plating solution contains an additive, so that the plating surface becomes glossy and smooth.

Note that, in the present disclosure, the "average width" of the plurality of wiring portions refers to a value obtained by averaging the maximum widths of the respective wiring portions in a cross section perpendicular to the longitudinal direction. The "main component" refers to a component having the largest content in terms of mass, for example, a component having a content of 50 mass % or greater. The "average grain size" refers to an average value of secondary grain sizes of copper crystal grains, and is defined as a median diameter ($D_{50}$) calculated from a cumulative distribution measured by a laser diffraction method.

Details of Embodiments of the Present Invention

Hereinafter, a printed wiring board and a method of manufacturing the printed wiring board according to embodiments of the present invention will be described in detail with reference to the accompanying drawings.

Printed Wiring Board

The printed wiring board of FIG. 1 includes an electrically insulating base film 1 and an electrically conductive pattern 2 stacked on one surface side of base film 1, and electrically conductive pattern 2 includes a plurality of wiring portions 11. Each of the plurality of wiring portions 11 includes a seed layer 11a having copper as a main component and a plating layer 11b having copper as a main component, and plating layer 11b is stacked on seed layer 11a. An average width W of the plurality of wiring portions 11 is 5 μm or greater and 20 μm or less.

A crystal plane of a copper crystal grain included in plating layer 11b having copper as a main component includes a (111) plane, a (200) plane, a (220) plane, and a (311) plane, and an intensity ratio $IR_{220}$ of an X-ray diffraction intensity of the (220) plane obtained by the following Equation 1 is 0.05 or greater and 0.14 or less.

$$IR220 = I_{220}/(I_{111}+I_{200}+I_{220}+I_{311}) \quad (1)$$

<Base Film>

Base film 1 contains a synthetic resin as a main component and has electrical insulation properties. Base film 1 is a base material layer for forming electrically conductive pattern 2. Base film 1 may have flexibility. When base film 1 has flexibility, the printed wiring board is used as a flexible printed wiring board.

Examples of the synthetic resin include polyimide, polyethylene terephthalate, liquid crystal polymer, and fluorine resin.

When the printed wiring board is a flexible printed wiring board, the lower limit of the average thickness of base film 1 is preferably 5 μm, and more preferably 10 μm. The upper limit of the average thickness of base film 1 is preferably 50 μm, and more preferably 40 μm. When the average thickness of base film 1 is less than the lower limit, the insulation strength of base film 1 may be insufficient. Conversely, when the average thickness of base film 1 exceeds the upper limit, the printed wiring board may be unnecessarily thick or the flexibility may be insufficient. Here, the average thickness of the base film is obtained by measuring the base film at 10 points by using a thickness measuring device and averaging the measurements.

<Electrically Conductive Pattern>

Electrically conductive pattern 2 is a layer of an electrically conductive material and includes the plurality of wiring portions 11. The plurality of wiring portions 11 are, for example, wiring forming a coil pattern. Further, electrically conductive pattern 2 may include a pattern other than the plurality of wiring portions 11, such as a land portion.

Electrically conductive pattern 2 includes seed layer 11a stacked on one surface of base film 1 and plating layer 11b stacked on one surface of seed layer 11a (a surface opposite to the surface on which base film 1 is stacked). Seed layer 11a and plating layer 11b are directly stacked in this order without other layers interposed therebetween. Electrically conductive pattern 2 has a two-layer structure of seed layer 11a and plating layer 11b.

<Seed layer>

Seed layer 11a is a metallic layer for forming plating in order to perform electroplating on one surface side of base film 1. Methods for stacking seed layer 11a on one surface of base film 1 are not particularly limited, and a known method, such as vapor deposition or sputtering, can be employed. Seed layer 11a may be a sintered layer of metallic particles obtained by applying an ink containing metallic particles to one surface of base film 1 and then sintering the metallic particles. The main component of seed layer 11a is copper, which has high adhesion to base film 1 and is suitable as a start surface for plating. Examples of metals other than copper include nickel, gold, silver, tungsten, molybdenum, tin, cobalt, chromium, iron, and zinc. The average thickness of seed layer 11a may be, for example, about 0.01 μm or greater and 2 μm or less from the viewpoint of improving the removing efficiency by etching while preventing the occurrence of a break in the in-plane direction.

<Plating layer>

Plating layer 11b is formed by electroplating. The main component of plating layer 11b is copper. Because copper has high electrical conductivity, is relatively inexpensive, and the main component of seed layer 11a is copper, high adhesion with seed layer 11a can be obtained. Plating layer 11b is preferably famed by electroplating using a copper-sulfate plating bath containing an additive, from the viewpoints of relatively low cost and easy adjustment of the thicknesses.

The crystal plane of the copper crystal grain included in plating layer 11b includes the (111) plane, the (200) plane, the (220) plane, and the (311) plane. The intensity ratio $IR_{220}$ of the X-ray diffraction intensity of the (220) plane obtained by the following formula (1) is 0.05 or greater and 0.14 or less.

$$IR_{220} = I_{220}/(I_{111}+I_{200}+I_{220}+I_{311}) \quad (1)$$

The lower limit of the intensity ratio $IR_{220}$ of the (220) plane is 0.05, and is preferably 0.08. The upper limit of the intensity ratio $IR_{220}$ of the (220) plane is 0.14, and is preferably 0.11. If the intensity ratio $IR_{220}$ of the (220) plane is less than the lower limit, the wiring portion may be chipped. Conversely, if the intensity ratio $IR_{220}$ of the (220) plane exceeds the upper limit, the wiring portion may be roughened at the time of manufacturing.

The average thickness of plating layers 11b is set depending on the electrically conductive pattern to be formed, and is not particularly limited. For example, the average thickness of the plating layers may be 1 μm or greater and 100 μm or less.

<Wiring portion>

The plurality of wiring portions 11 are formed linearly and substantially in the same shape. The lower limit of the average width W of the plurality of wiring portions 11 is 5 μm as described above, and is preferably 6 μm. The upper limit of the average width W of the plurality of wiring portions 11 is 20 μm as described above, and is preferably 18 μm. If the average width W is less than the lower limit, it may be difficult to manufacture the plurality of wiring portions 11. Conversely, if the average width W exceeds the upper limit, it may be difficult to obtain a desired wiring density.

The lower limit of the average grain size of the copper crystal grains is preferably 0.2 μm, more preferably 0.5 μm, and still more preferably 1.5 μm. The upper limit of the average grain size of the copper crystal grains is preferably 8 μm as described above, more preferably 6 μm, and still more preferably 5 μm. As such, when the average grain size of the copper crystal grains is less than the lower limit, the average grain size may vary and the surface of the wiring portion may be roughened.
Conversely, if the average grain size of the copper crystal grains exceeds the upper limit, the wiring portion may be chipped.

The intensity ratio $IR_{111}$ of the X-ray diffraction intensity of the (111) plane of the copper crystal grain obtained by the following formula (2) is preferably 0.74 or greater, more preferably 0.75 or greater, and still more preferably 0.79 or greater.

$$IR_{111}=I_{111}/(I_{111}+I_{200}+I_{220}+I_{311}) \quad (2)$$

As described above, when the intensity ratio $IR_{111}$ of the (111) plane is within the above-described numerical range, variation in the grain size of the copper crystal grains can be suppressed, and roughness of the surfaces of the plurality of wiring portions 11 can be reduced.

When the average width W of the plurality of wiring portions 11 is 20 μm, the intensity ratio $IR_{220}$ of the (220) plane of the copper crystal grain may be preferably 0.14 or less, and when the average width W of wiring portions 11 is 15 μm, the intensity ratio $IR_{220}$ of the (220) plane may be preferably 0.11 or less. When the intensity ratio IR220 of the (220) plane is equal to or less than the numerical value under the condition that the average width W of the plurality of wiring portions 11 is a specific value, roughness of the surfaces of the plurality of wiring portions 11 can be reduced.

When the average width W of the plurality of wiring portions 11 is 10 μm, the intensity ratio $IR_{220}$ of the (220) plane of the copper crystal grain may be preferably 0.08 or less. As described above, even if the average width W of the plurality of wiring portions 11 is 10 μm, when the intensity ratio $I_{220}$ of the (220) plane of the copper crystal grain is 0.08 or less, roughness of the surfaces of the plurality of wiring portions 11 can be reduced.

Method of Manufacturing Printed Wiring Board

Next, an example of the method of manufacturing the printed wiring board of FIG. 1 will be described with reference to FIGS. 2 to 5.

The method of manufacturing the printed wiring board includes a step of forming electrically conductive pattern 2 including the plurality of wiring portions 11, by a semi-additive process, on at least one surface side of the electrically insulating base film (a step of forming the electrically conductive pattern). The step of forming the electrically conductive pattern includes a step of stacking seed layer 11a containing copper as a main component on one surface side of base film 1 (a step of stacking the seed layer), a step of forming a resist pattern R on a surface of seed layer 11a stacked in the step of stacking the seed layer, the resist pattern having a reversal shape of the plurality of wiring portions 11 (a step of forming the resist pattern), a step of stacking plating layer layer 11b containing copper as a main component on the surface of seed layer 11a after the step of foaming the resist pattern (a step of stacking the plating layer), a step of removing resist pattern R after the step of stacking the plating layer (a step of removing the resist pattern), and a step of removing, by etching, seed layer 11a exposed by the step of removing the resist pattern, after an elapse of 24 hours or greater since an end of the step of stacking the plating layer (a step of etching).

Figure 2:
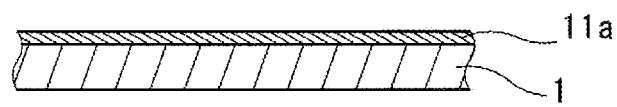
FIG. 2 is a schematic cross-sectional view illustrating a step of stacking a seed layer in a method of manufacturing the printed wiring board of FIG. 1.
Figure 3:
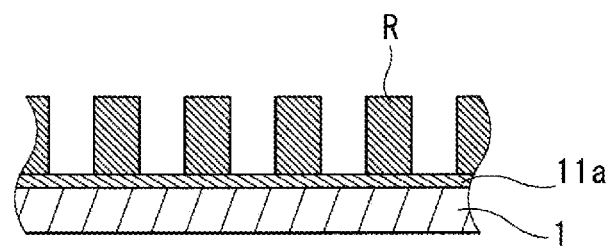
FIG. 3 is a schematic cross-sectional view illustrating a step of forming a resist pattern in the method of manufacturing the printed wiring board of FIG. 1.

In the step of forming the electrically conductive pattern, first, seed layer 11a is stacked on substantially the entire one surface of base film 1 (FIG. 2), and then resist pattern R having a reversal shape of the wiring portions 11 is formed on a surface of seed layer 11a (FIG. 3). Subsequently, after plating layer 11b is stacked on non-stacked regions of resist pattern R on the surface of seed layer 11a after the step of forming the resist pattern (FIG. 4), resist pattern R is peeled and removed (FIG. 5), and after an elapse of 24 hours or greater since an end of the step of stacking the plating layer, a portion of seed layer 11a that is exposed by the step of removing resist pattern R is removed by etching to form the plurality of wiring portions 11 (FIG. 1).

(Step of Stacking Seed Layer)

In the step of stacking the seed layer, as illustrated in FIG. 2, seed layer 11a (the metallic layer) for plating in order to perform electroplating is stacked on substantially the entire surface of one surface of base film 1. Methods for stacking seed layer 11a in the step of stacking the seed layer are not particularly limited, and examples thereof include vapor deposition methods and sputtering methods. In the step of stacking the seed layer, a sintered layer of metal particles may be stacked on one surface of base film 1 by applying an ink containing the metal particles to substantially the entire surface of the one surface of base film 1 and sintering the metal particles. The main component of seed layer 11a is preferably copper, which has high adhesion to base film 1 and is suitable as a start surface for plating. Examples of metals other than copper include nickel, gold, silver, tungsten, molybdenum, tin, cobalt, chromium, iron, and zinc.

(Step of Forming Resist Pattern)

In the step of forming the resist pattern, first, a photoresist film is formed on substantially the entire surface of seed layer 11a stacked in the step of stacking the seed layer. This photoresist film is formed of a negative resist composition in which the binding of a polymer is strengthened by exposure to light and the solubility in a developing solution decreases, or a positive resist composition in which the binding of a polymer is weakened by exposure to light and the solubility in a developing solution increases.

In the step of forming the resist pattern, first, the photoresist film is formed on the surface of seed layer 11a, for example, by applying and drying a liquid resist composition or by thermocompression bonding of a dry film resist having no fluidity at room temperature.

Next, in the step of forming the resist pattern, the photoresist film is selectively exposed to light by using a photomask or the like to form a portion soluble in a developing solution and a portion insoluble in the developing solution in the photoresist film. Subsequently, as illustrated in FIG. 3, the highly soluble portions of the photoresist film are washed away using the developing solution to form resist pattern R having openings corresponding to the formation regions of the plurality of wiring portions 11.

(Step of Stacking Plating Layer)

Figure 4:
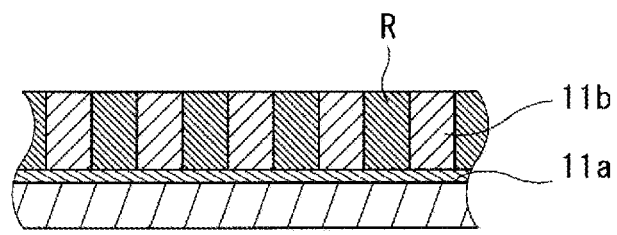
FIG. 4 is a schematic cross-sectional view illustrating a step of stacking a plating layer in the method of manufacturing the printed wiring board of FIG. 1.

In the step of stacking the plating layer, as illustrated in FIG. 4, plating layer 11b is stacked on the surface of seed layer 11a. In the step of stacking the plating layer, plating layer 11b is stacked on non-stacked regions of resist pattern R (regions corresponding to the openings of resist pattern R) of the surface of seed layer 11a.

The metal used in the step of stacking the plating layer is copper. Since copper has high electrical conductivity, is relatively inexpensive, and the main component of seed layer 11a is copper, high adhesion with seed layer 11a can be obtained. Examples of the metal other than copper include nickel and silver. Since copper is used as a metal in the step of stacking the plating layer, it is preferable to perform electroplating using a copper-sulfate plating bath containing an additive from the viewpoints of a relatively low cost and easy adjustment of the thickness of plating layer 11b.

A content of copper of the plating solution used in the step of stacking the plating layer is 2 mass % or greater. The content of copper of the plating solution is 2 mass % or greater, so that copper ions necessary for plating can be supplied. The additive in this embodiment includes a suppressor, a brightener, and a leveler. Due to the additive, the plating solution can form a uniform copper film having high surface activity with few irregularities. As the suppressor in the present embodiment, for example, a compound such as a polyalkylene glycol compound is used. The suppressor has a coat film-forming effect. As the brightener in this embodiment, for example, a compound such as 3-mercaptopropane sulfonic acid or bis (3-sulfopropyl) disulfide disodium salt is used. The brightener has an interfacial complexing effect. As the leveler in this embodiment, for example, a compound such as benzothiazole is used. The leveler has the effect of smoothing the plating surface.

(Step of Removing Resist Pattern)

Figure 5:
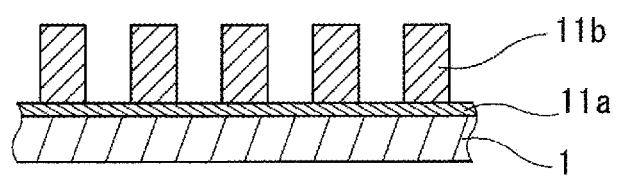
FIG. 5 is a schematic cross-sectional view illustrating a step of removing a resist pattern in the method of manufacturing the printed wiring board of FIG. 1.

In the step of removing the resist pattern, as illustrated in FIG. 5, resist pattern R is removed by peeling resist pattern R from seed layer 11a. To be specific, a stacked body (FIG. 4), obtained after the step of stacking the plating layer, including base film 1, seed layer 11a, plating layer 11b, and resist pattern R is immersed in a peeling solution, so that resist pattern R is expanded by the peeling solution. As a result, repulsive forces are generated between resist pattern R and seed layer 11a, and resist pattern R is peeled from seed layer 11a. A known peeling solution can be used as the peeling solution.

(Etching Step)

In the etching step, the exposed portion of seed layer 11a that is exposed by the removal of resist pattern R is removed by etching. The etching is performed after an elapse of 24 hours or greater since the step of stacking the plating layer. This etching uses an etching solution that erodes the metals forming seed layer 11a and plating layer 11b. By removing seed layer 11a, the plurality of wiring portions 11 are formed on one surface side of base film 1 as illustrated in FIG. 1.

Other Embodiments

It should be understood that the embodiments disclosed herein are illustrative and non-restrictive in any respect. The scope of the present invention is not limited to the configuration of the above-described embodiment, but is indicated by the scope of claims, and is intended to include all modifications within the scope and meaning equivalent to the scope of claims.

For example, in the above-described embodiment, a configuration in which the electrically conductive pattern is stacked on one surface side of the base film has been described. However, in the printed wiring board, a pair of electrically conductive patterns may be stacked on both surface sides of the base film. The method of manufacturing the printed wiring board may also form a pair of electrically conductive patterns on both sides of the base film.

EXAMPLES

Hereinafter, the present invention will be described in more detail with reference to Examples, but the present invention is not limited to these Examples.

[No. 1]

A base film made of a polyimide film ("Apical NPI" manufactured by Kaneka Corporation) having an average thickness of 25 μm was prepared. An electrically conductive pattern including a plurality of wiring portions (1000 portions) was formed on one surface side of the base film by a semi-additive process (the step of forming the electrically conductive pattern). Specifically, first, a copper nanoparticle dispersion liquid, in which copper nanoparticles were dispersed in water was applied to one surface of the base film and baked, thereby stacking a seed layer having an average thickness of 0.3 μm formed of a sintered body of the copper nanoparticles on one surface of the base film (the step of stacking the seed layer). Next, a photoresist film was stacked on substantially the entire surface of the seed layer stacked in the step of stacking the seed layer by thermocompression bonding of an acrylic dry film resist. Then, the photoresist film was selectively exposed to light using a photomask, thereby forming a portion soluble in a developer and a portion insoluble in the developer in the photoresist film. Then, the highly soluble portions of the photoresist film were washed away using the developer to foam a resist pattern having openings corresponding to formation regions of the plurality of wiring portions (the step of forming the resist pattern).

Next, copper electroplating was performed on the surface of the seed layer after the resist pattern formation to stack a plating layer having an average thickness of 10 μm (the step of stacking the plating layer). The copper electroplating was carried out under the following conditions.

Composition of the plating solution contained in the plating bath: Copper sulfate pentahydrate 100 g/L, sulfuric acid 200 g/L, chlorine 45 mg/L, additive (BSC10-A2 (Ishihara Chemical Co., Ltd.) 2 mL/L, BSC10-B (Ishihara Chemical Co., Ltd.) 1.5 mL/L, BSC10-C (Ishihara Chemical Co., Ltd.) 6 mL/L)

Plating bath temperature : 25° C.

Anode: insoluble anode

Next, the resist pattern was removed using a peeling solution (the step of removing the resist pattern), and the X-ray diffraction intensities $I_{111}$, $I_{200}$, $I_{220}$, and $I_{311}$ of the (111) plane, (200) plane, (220) plane, and (311) plane of the copper crystal grains contained in the plating layer were measured with an X-ray diffractometer (manufactured by Malven-Panalytical). The average grain size of the copper crystal grains was measured with a scanning electron microscope (manufactured by Hitachi High-Technologies Corporation). (X-ray diffraction measurement)

The measurement conditions are as follows.

Apparatus: EMPYREAN (manufactured by Malven-Panalytical)

X-ray used: Cu-K α ray line focus

Excitation conditions: 45 kv 40 mA

Incident optical system: mirror

Slit: 1/2

Mask: 10 mm

Sample stage: X-Y-Z

Light receiving optical system: flat plate collimator 0.27

Scanning method: θ-2θ scan 2θ scan

Measurement range: 2θ=15°-100°
Incident angle: 1°
Step width: 0.03°
Integrated time: 1 sec Next, the exposed portion of the seed layer that is exposed by the removal of the resist pattern was removed by etching (the etching step), and a printed wiring board No. 1 was manufactured. The average width of the plurality of wiring portions of the printed wiring board No. 1 is shown in Table 1.

The upper surfaces of the wiring portions of the printed wiring board No. 1 were photographed with an electron microscope (manufactured by Hitachi High-Technologies Corporation). The number of detected defects on the surfaces of the wiring portions was confirmed in the photographed image. The results are shown in Table 1.

[No. 2]

A printed wiring board No. 2 was manufactured in the same manner as the printed wiring board No. 1 except that after the step of removing the resist pattern, the X-ray diffraction measurement and the average particle size measurement were performed after an elapse of 24 hours since the step of stacking the plating layer, and then the etching step was performed. The average width of the plurality of wiring portions of the printed wiring board No. 2 is shown in Table 1.

The upper surfaces of the wiring portions of the printed wiring board No. 2 were photographed with an electron microscope. The number of detected defects on the surfaces of the wiring portions was confirmed in the photographed image. The results are shown in Table 1.

[No. 3-No. 5]

Printed wiring boards No. 3 to No. 5 were manufactured in the same manner as the printed wiring board No. 2 except for the time elapsed after the step of stacking the plating layer. The elapsed time and the average width of the plurality of wiring portions of the printed wiring boards No. 3 to No. 5 are shown in Table 1.

The upper surfaces of the wiring portions of the printed wiring boards No. 3-No. 5 were photographed with an electron microscope. The number of detected defects on the surfaces of the wiring portions was confirmed in the photographed image. The results are shown in Table 1.

TABLE 1

| | | | No. 1 | No. 2 | No. 3 | No. 4 | No. 5 |
|---|---|---|---|---|---|---|---|
| TIME ELAPSED AFTER STEP OF STACKING PLATING LAYER [HOUR] | | | 0 | 24 | 30 | 40 | 48 |
| COPPER CRYSTAL GRAIN | AVERAGE GRAIN SIZE [μm] | | 0.0094 | 0.2 | 1.0 | 1.5 | 1.5 |
| | STANDARD DEVIATION [μm] | | 0.23 | 2.60 | 5.40 | 9.60 | 9.60 |
| INTENSITY RATIO | IR220 | | 0.22 | 0.14 | 0.11 | 0.08 | 0.08 |
| | IR111 | | 0.69 | 0.74 | 0.75 | 0.79 | 0.79 |
| | IR311 | | 0.05 | 0.07 | 0.08 | 0.08 | 0.08 |
| | IR200 | | 0.03 | 0.05 | 0.06 | 0.05 | 0.05 |
| IMAGE RECOGNITION EVALUATION | AVERAGE WIDTH OF WIRING PORTION [μm] | 5 | C | B | A | S | S |
| | | 8 | C | B | A | S | S |
| | | 10 | B | A | S | S | S |
| | | 15 | B | A | S | S | S |
| | | 20 | A | S | S | S | S |

<Quality of Printed Wiring Board>
(Copper Crystal Grain)

"average grain size" refers to an average value of secondary grain sizes of copper crystal grains, and is defined as a median size (Dsd calculated from a cumulative distribution measured by a laser diffraction method.

(Intensity Ratio)

From the X-ray diffraction intensities $I_{111}$, $I_{200}$, $I_{220}$, and $I_{311}$ of the (111) plane, (200) plane, (220) plane, and (311) plane belonging to the copper crystal grain, the respective intensity ratios IR were obtained by the following equations (1) to (4).

$$IR_{220}I_{220}/(I_{111}+I_{200}+I_{220}I_{311}) \tag{1}$$

$$IR_{111}I_{111}/(I_{111}+I_{200}+I_{220}+I_{311}) \tag{2}$$

$$IR_{311}=I_{311}/(I_{111}+I_{200}+I_{220}+I_{311}) \tag{3}$$

$$IR_{200}=I_{200}/(I_{111}+I_{200}+I_{220}I_{311}) \tag{4}$$

(Image Recognition Evaluation)

The upper surfaces of the wiring portions of the manufactured printed wiring board were photographed with an electron microscope to obtain an image, and the number of detected defects of the printed wiring board was confirmed from the obtained image (image recognition evaluation). The image recognition evaluation was rated according to the following criteria. The results are shown in Table 1. Here, the number of detected defects of the printed wiring board is a number obtained by counting defects in which discoloration is detected but discoloration is not observed when confirmed with a stereoscopic microscope. Note that the defect is roughness of the surface of the wiring portion.

Evaluation S : The number of detected defects is 1 per $m^2$ or less

Evaluation A : The number of detected defects is greater than 1 per $m^2$ and 100 per $m^2$ or less.

Evaluation B : The number of detected defects is greater than 100 per $m^2$ and 1000 per $m^2$ or less.

Evaluation C : The number of detected defects is greater than 1000 per $m^2$

<Evaluation Results>

Table 1 indicates that in the printed wiring board No. 1, as the average width of the wiring portions becomes narrower, the number of detected defects increases. With respect to this, in the printed wiring boards No. 2 to No. 5, the number of detected defects decreases compared to the printed wiring board No. 1 in all the average widths of the wiring portions. Among them, in the printed wiring boards No. 4 and No. 5, the image recognition evaluation is the S evaluation in all the average widths of the wiring portions. This indicates that the intensity ratio $IR_{220}$ (the composition ratio) of the (220) plane decreases and the average grain size of the copper crystal grains increases with the passage of time, until etching after the step of stacking the plating layer, which reduces the number of defects detected, that is, reduces roughness of the wiring portion surfaces.

DESCRIPTION OF THE REFERENCE NUMERALS

1 base film
2 electrically conductive pattern
11 wiring portion
11a seed layer
11b plating layer
R resist pattern

The invention claimed is:

1. A printed wiring board comprising:
   an electrically insulating base film; and
   an electrically conductive pattern stacked on at least one surface side of the base film,
   wherein the electrically conductive pattern includes a plurality of wiring portions,
   wherein an average width of the plurality of wiring portions is 5 μm or greater and 20 μm or less,
   wherein each of the plurality of wiring portions includes a seed layer containing copper as a main component and a plating layer containing copper as a main component, the plating layer being stacked on the seed layer,
   wherein crystal planes of copper crystal grains included in the plating layer include a (111) plane, a (200) plane, a (220) plane, and a (311) plane, and
   wherein an intensity ratio $IR_{220}$ of an X-ray diffraction intensity of the (220) plane obtained by Equation (1) below is 0.05 or greater and 0.14 or less, $$IR_{220} = I_{220}/(I_{111} + I_{200} + I_{220} + I_{311}) \quad (1)$$

(where $I_{111}$ is an X-ray diffraction intensity of the (111) plane, $I_{200}$ is an X-ray diffraction intensity of the (200) plane, $I_{220}$ is an X-ray diffraction intensity of the (220) plane, and $I_{311}$ is an X-ray diffraction intensity of the (311) plane in Equation (1)).

2. The printed wiring board according to claim 1, wherein an average grain size of the copper crystal grains is 0.2 μm or greater and 8 μm or less and is equal to or less than the average width of the plurality of wiring portions.

3. The printed wiring board according to claim 1, wherein an intensity ratio $IR_{111}$ of the X-ray diffraction intensity of the (111) plane obtained by Equation (2) below is 0.74 or greater, $$IR_{111} = I_{111}/(I_{111} + I_{200} + I_{311}) \quad (2)$$

(where $I_{111}$, $I_{200}$, $I_{220}$, and $I_{311}$ in Equation (2) are as defined for Equation (1)).

4. The printed wiring board according to claim 1, wherein the intensity ratio IR220 of the (220) plane is 0.14 or less when the average width of the plurality of wiring portions is 20 μm, and the intensity ratio $IR_{220}$ of the (220) plane is 0.11 or less when the average width of the plurality of wiring portions is 15 μm.

5. The printed wiring board according to claim 1, wherein the intensity ratio $IR_{220}$ of the (220) plane is 0.08 or less when the average width of the plurality of wiring portions is 10 μm.

6. A method of manufacturing a printed wiring board, comprising:
   forming an electrically conductive pattern including a plurality of wiring portions, by a semi-additive process, on at least one surface side of an electrically insulating base film,
   wherein the forming of the electrically conductive pattern includes
   stacking a seed layer containing copper as a main component on the one surface side of the base film,
   forming a resist pattern on a surface of the seed layer, the resist pattern having a reversal shape of the plurality of wiring portions,
   stacking a plating layer containing copper as a main component on the surface of the seed layer after the forming of the resist pattern,
   removing the resist pattern after the stacking of the plating layer, and
   removing, by etching, the seed layer exposed by the removing of the resist pattern, after an elapse of 24 hours or greater since an end of the stacking of the plating layer.

7. The method of manufacturing the printed wiring board according to claim 6, wherein a content of copper in a plating solution that is used in the stacking of the plating layer is 2 mass % or greater, and the plating solution contains an additive.

* * * * *